United States Patent [19]

Niino

[11] Patent Number: 4,998,979

[45] Date of Patent: Mar. 12, 1991

[54] METHOD FOR WASHING DEPOSITION FILM-FORMING DEVICE

[75] Inventor: Hiroaki Niino, Nagahama, Japan

[73] Assignee: Canon Kabushiki Kaisha, Tokyo, Japan

[21] Appl. No.: 362,016

[22] Filed: Jun. 6, 1989

[30] Foreign Application Priority Data

Jun. 6, 1988 [JP] Japan .................................. 63-138868
Jun. 2, 1989 [JP] Japan .................................. 1-139263

[51] Int. Cl.$^5$ .......................... C03C 15/00; B08B 7/00
[52] U.S. Cl. ........................................ 134/1; 156/643
[58] Field of Search ............................. 134/1; 156/643

[56] References Cited

U.S. PATENT DOCUMENTS 4,310,380 1/1982 Flamm ................................ 156/643
4,498,953 2/1985 Cook ................................... 156/646
4,581,101 4/1986 Senoue ............................... 156/643
4,787,957 11/1988 Barkanic ............................. 156/643

FOREIGN PATENT DOCUMENTS 0144401 10/1980 German Democratic Rep. .... 134/1
8001363 7/1980 World Int. Prop. O. ............. 134/1

Primary Examiner—Olik Chaudhuri
Assistant Examiner—Ourmazd S. Ojan
Attorney, Agent, or Firm—Fitzpatrick, Cella Harper & Scinto

[57] ABSTRACT

A method for washing a deposition film-forming device for forming deposition films comprises removing the reaction product attached on the interior of the reaction vessel during formation of the deposition film with $ClF_3$ gas.

4 Claims, 4 Drawing Sheets

METHOD FOR WASHING DEPOSITION FILM-FORMING DEVICE

BACKGROUND OF THE INVENTION

1. Field of the Invention

The present invention relates to a method for washing a deposition film-forming device which forms a deposition film according to dry methods or wet methods (especially, the vapor phase methods such as the microwave plasma CVD method). In particular, the present invention relates to an invention effective in a method for washing a device for the formation of deposition films which can be suitably utilized as semiconductor devices such as photoconductive member for electrophotography, line sensor for inputting images, image pickup device, solar battery, etc. Further, the present invention relates to a washing method considerably useful for a device for the preparation of an amorphous semiconductor film composed mainly of silicon according to the microwave plasma CVD method.

Related Background Art

Hitherto, the process for the formation of deposition films forming deposition film on substrates according to the vapor phase method are used for the preparation of semiconductor elements such as photoconductive members in electrophotography, sensors for image-input, image-pickup devices, solar battery, etc. The formation of deposition film according to the vapor phase method, is useful in the point that a deposition film having uniform properties and large area can be prepared. However, a part of the reactive products attaches as deposition or powder on the portion other than desired substrate, e.g. inner wall etc. of the reaction vessel. The deposition or attachment (attached material) peels off and flies to attach on the substrate. This occasionally causes film defects such as pinhole, etc.

Methods for washing deposition film-forming devices in order to remove reaction products attached on the interior of reaction chamber etc., as described in U.S. Pat. No. 4529474, Japanese Patent Laid-open Sho-59-142839 among others. They disclose a method for removing said reaction product by use of a mixture of $CF_4$ and $O_2$ as an etchant.

Specifically, U.S. Pat. No. 4529474 describes that polysilane attached on the inner wall is removed by washing the reaction vessel, in which amorphous deposition films are formed, by use of a mixture of $CF_4$ and $O_2$.

Japanese Patent Laid-open Sho-59-142839 describes that a mixture of $CF_4$ and $O_2$ is useful for washing a plasma CVD apparatus for the formation of silicon carbide films.

There are various methods for the formation of deposition films according to the vapour phase method. The so called microwave plasma CVD method utilizing microwave energy has been known as one of them.

The process to form a deposition film on a substrate according to the microwave plasma CVD method (hereinafter represented as μW-PCVD method) has been attracting attention since the process is capable of high speed film formation of deposition films and efficient utilization of starting gases. As one of such deposit film-forming method according to μW-PCVD methods, there has been proposed a method in which starting gases for formation of deposition film are introduced into a space surrounded with a plurality of substrates and discharging is caused to occur by microwave energy in said space, thereby forming a deposition film on the substrate. Such deposition film formation method utilizing microwave energy is practiced with the device and according to the film-forming method as described below.

Now, the respective parts of the deposition film-forming device and the film-forming procedure are described by referring to the drawings.

FIG. 1 is a schematic side sectional illustration of a deposition film formation device according to the μW-PCVD method, and FIG. 2 is a plan sectional illustration of said device. FIG. 3 is a schematic view for explaining schematically the whole of said device.

The deposition film-forming device shown in FIG. 1 and FIG. 2 is constituted as follows. That is, it is constituted of reaction vessels which can be reduced in pressure (101, 201), microwave introducing windows made of alumina ceramic (102, 202), a waveguide for microwave (103), discharging pipes (104, 204), cylindrical substrates (105, 205) (when the substrates are shaped in plate, said plate substrates are fixed onto the surface of a cylindrical substrate holder (107, 207) with a tool not shown, and a deposition film is formed on the substrate), heaters for heating substrates (107'), pipes (108, 208) for the introduction of starting gases, and a motor for rotating substrates (110). Said pipes for the introduction of starting gases are connected through valves (not shown) and mass flow controllers (not shown) to the bombs (not shown) of starting gases such as $SiH_4$, $SiF_4$, $GeH_4$, $H_2$, $CH_4$, $C_2H_2$, $B_2H_6$, $PH_3$, etc. Also, the above discharging pipes (104, 204) are connected to a diffusion pump not shown.

The whole of the deposition film-forming device according to the μW-PCVD method is shown schematically in FIG. 3.

That is, an electric source for microwave of 2.45 GHz (311) is connected to a reaction vessel (301) though an isolator (312), a power monitor (313) and a stub-tuner (314) by means of a waveguide (303). The isolator (312) services as an absorber for preventing the microwave generated in the microwave electric source (311) from returning again to the microwave electric source. The power monitor (313) monitors powers of the incident wave and the reflected wave. The stub-tuner (314) adjusts electric powers of the incident wave and the reflected wave. The starting gases fed from an apparatus for feeding starting gases are introduced into the reaction vessel through pipes (308) for the introduction of starting gases. A reaction vessel (301) connects to an evacuation pump 315 through a discharging pipe.

Formation of deposition film may be practiced as described below by use of the above deposition film-forming device explained by use of FIGS. 1 and 2.

First, the cylindrical substrates (105, 205) are set within the reaction vessel (101, 201), the substrates are rotated by the motor for rotating substrate (110) and the pressure inside the reaction vessel (101, 201) is reduced to $10^{-6}$ Torr or lower by the action of a diffusion pump (not shown). Subsequently, the temperature of the cylindrical substrates is controlled to a desired temperature of 20° C. to 400° C. by the heaters for heating cylindrical substrates (107').

When the cylindrical substrates (105, 205) reach the desired temperature, desired starting gases are introduced into the discharging spaces (106, 206) (namely the film-forming spaces) through the gas introducing pipe (108, 208) from the gas bombs (not shown). The inner pressure in the discharging space is then controlled at a desired pressure of 1 Torr or less.

After the inner pressure is stabilized, microwave energy is introduced into the discharging spaces (106, 206) from the microwave power source (not shown) through the waveguide (103) and the microwave introducing window (102, 202). By the microwave energy, the above starting gases are decomposed, whereby desired deposition films can be formed on the cylindrical substrates.

By use of the device constitution and the film-forming method as described above in addition to use of the $\mu$W-PCVD method excellent in decomposition efficiency of gas, the starting gases can be decomposed at substantially 100% in the discharging space to form a deposition film on the substrates. Accordingly, in the film formation by conventional $\mu$W-PCVD method, cleaning of the reaction vessels has been deemed to be unnecessary, and there has been no literature which reports that cleaning of the interior of reaction vessel is necessary in such film-forming method.

However, if deposited films are formed for a large number of times without cleaning by use of the above-mentioned $\mu$W-PCVD device, there has been recognized the phenomenon that film defects such as pinehole, etc. are generated in the deposition films, and that the number and area of fine image defects increase gradually upon the practical application to photoconductive members for electrophotography. This phenomenon has proved to be a great problem in production of photoconductive members for electrophotography.

Of course, this is not only a problem in photoconductive members for electrophotography, but also in the field requiring a uniform deposition film. Further, it has been found that the attachment on the inner wall of the $\mu$W-PCVD device can not be effectively removed by means of conventional washing method for deposition film.

SUMMARY OF THE INVENTION

The present invention has been accomplished in view of the problems in conventional methods as described above, and an object of the present invention is to provide a method for washing the deposition film-forming device for efficiently producing deposition films, which can provide satisfactory preparation results free of denatured products.

Another object of the present invention is to provide a method for washing the deposition film-forming device which can improve productivity by controlling generation of image defects in photoconductive members for electrophotography according to the $\mu$W-PCVD method, in application to photoconductive members for electrophotography of the deposition film.

Still another object of the present invention is to provide a method for washing the deposition film-forming device which can improve productivity by cleaning effectively the denatured products attached on the inner wall of the reaction vessel.

Further, an object of the present invention is to provide a method for washing a deposition film-forming device which forms a deposition film by the vapor phase method, which comprises removing the reaction product attached on the inner wall of a reaction vessel with $ClF_3$ gas during formation of the functional deposition film on substrates arranged in the reaction vessel by utilizing microwave energy.

According to an aspect of the present invention, there is provided a method for washing a deposition film-forming device for forming deposition films, which comprises removing the reaction product attached on the interior of the reaction vessel during formation of the deposition film with $ClF_3$ gas.

DESCRIPTION OF THE PREFERRED EMBODIMENTS

Figure 1:
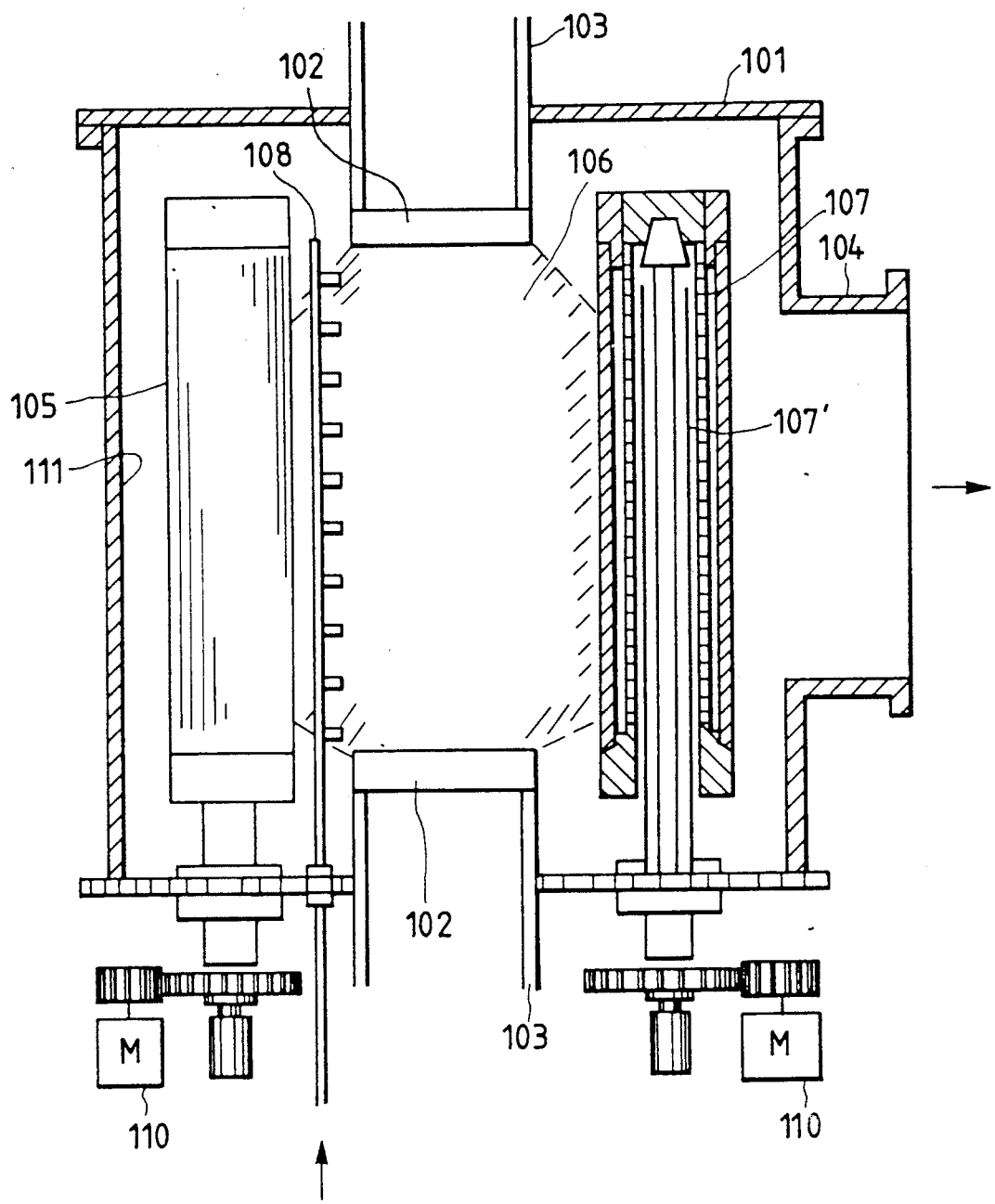
FIG. 1 and FIG. 2 are schematic illustrations of side sectional view and plan view of the deposition film-forming device according to the microwave plasma CVD method which can be used in practicing the present invention, respectively.

A preferred method for washing a deposition film-forming device according to the present invention is characterized in that the method for washing a deposition film-forming device which forms a deposition film by the vapor phase method, which comprises removing the reaction product attached on the inner wall forming the space for passing the gases during the formation of deposition films on substrates arranged in the reaction vessel by utilizing microwave energy, by use of $ClF_3$ gas.

By practicing the present invention, the unnecessary denatured products attached on the inner wall of the reaction vessel can be cleaned effectively. By the present invention, it is possible to prevent the denatured products attached on the inner wall of the reaction vessel from falling on a substrate on which a deposition film is formed and to prevent the generation of film defects such as pinhole in the deposition film. In the case that the deposition film is applied to the photoconductive member for electrophotography, the generation of image defect is remarkably suppressed and it is possible to give an excellent photoconductive member for electrophotography capable of forming images of high quality. Further, productivity can also be improved considerably since the yield in the preparation can be remarkably improved.

The present invention has been accomplished on the basis of the findings obtained by the present inventor as described below.

It has been found that a part of the reaction products, although minute in amount, will attach as coating on the portion other than the desired substrate, namely the inner wall of the reaction vessel, when the formation of deposition films of silicon is repeated even according to the $\mu$W-PCVD method as described above. Although such coating poses no problem after film formation for about several times, if repeated film formation is performed without performing cleaning step, the thickness of the coating will be gradually increased as the time of film formation is increased, until it will be peeled off. The small strip peeled off may fly through the reaction vessel to attach onto the substrate on which a deposition film is to be formed, which may become a cause for giving rise to film defects such as pinhole, etc.

Such attached matter is different from the deposition film formed on the substrate according to the above film-forming method (μW-PCVD method), and also different from the so called polysilane which attaches on the inner wall of the reaction vessel during formation of deposition film according to, for example, the high frequency plasma CVD method, which has been found to be unremovable by, for example, plasma etching by use of $CF_4$ and $O_2$, etc. Further, from the analytical results by the present inventors, these attached products have been found to be denatured products composed mainly of silicon.

On the basis of such findings, the means for removing effectively the above denatured products has been intensively investigated, and consequently the present inventor has found that the denatured products attached on the inner wall of the reaction vessel can be effectively removed by use of $ClF_3$ as the cleaning gas and that image defects in the deposition film can be remarkably suppressed. Consequently, it has been confirmed that the production yield can be increased and that productivity can be improved to a great extent to accomplish the object.

In the following, according to experimental examples, the effect of present invention will be described in detail.

EXPERIMENTAL EXAMPLE 1

Figure 2:
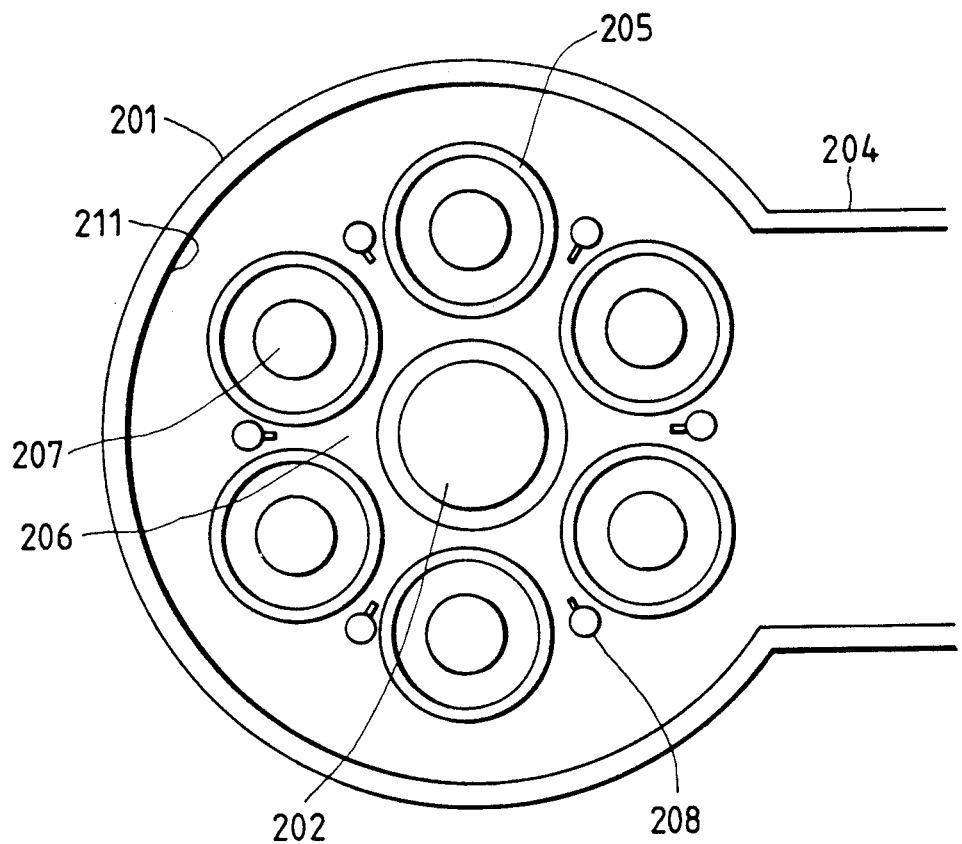
Figure 3:
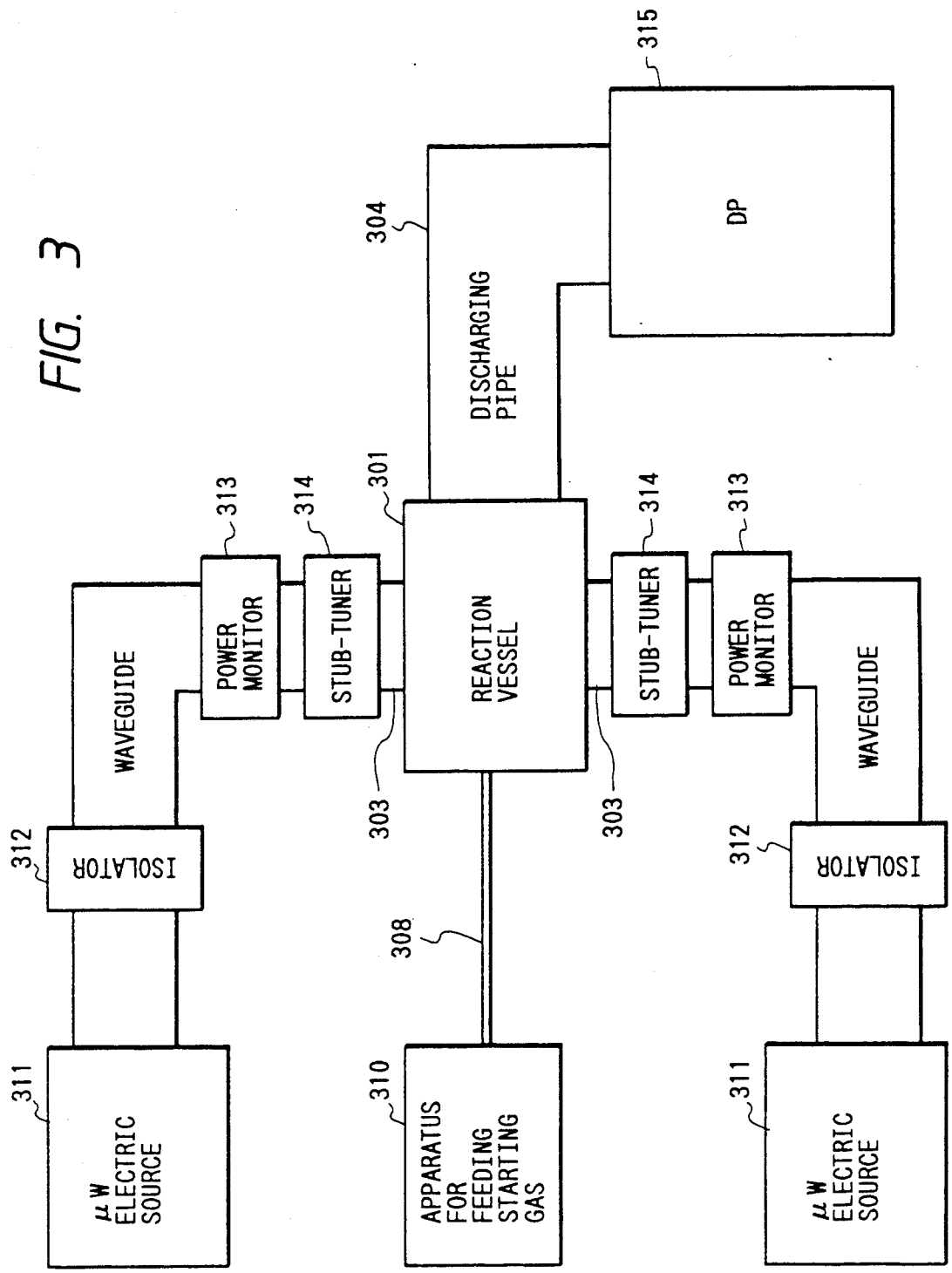
FIG. 3 is a schematic view for explaining schematically the whole of said device.

In this example, the deposition film-forming device according to the μW-PCVD method as shown in FIG. 1 to FIG. 3 was first used. Aluminum substrates of 5 cm×5 cm square were pressure contacted at several places on the reaction vessel inner wall (111, 211). Then, amorphous silicon films of 10μ in thickness were deposited on cylindrical substrates (105, 205) under the preparation conditions shown in Table 1 according to the abovementioned method. After the cylindrical substrates on which the amorphous silicon films were deposited were taken out from the reaction vessel, the new cylindrical substrates were arranged in the reaction vessel, and then amorphous silicon films were deposited on the substrates. This step was repeated ten times.

TABLE 1

| Preparation Conditions | | |
|---|---|---|
| Induced gases | $SiH_4$ | 700 sccm |
| | $H_2$ | 500 sccm |
| Inner pressure of reaction vessel | | 0.5 mTorr |
| μW power | | 0.5 W/cm$^3$ |

Figure 4:
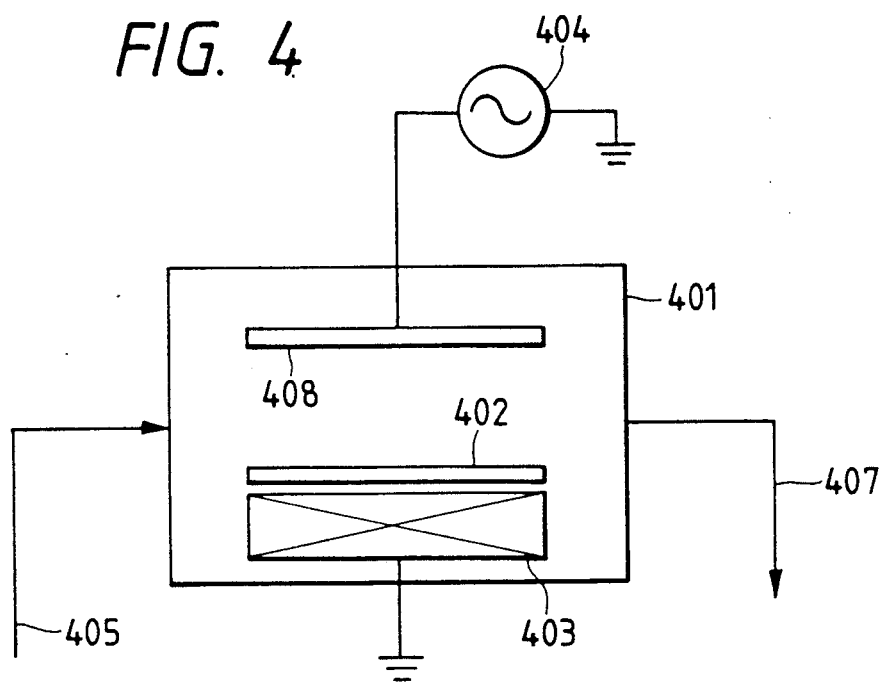
FIG. 4 is a schematic view for explaining schematically construction of the deposition film-forming device using RF electric source.

Then, the aluminum substrates were removed from the inner wall of the reaction vessel, followed by transferring the high frequency plasma CVD device shown in FIG. 4. Then, the denatured products accumulated on the aluminum substrates were removed by etching with various etching gases.

In the abovementioned procedure, the aluminum substrates were transferred from the device for the formation of deposition films according to the μW-PCVD method shown in FIGS. 1 and 2 to the high frequency plasma CVD device shown in FIG. 4 in order to compare the etching effects between the conventional etching gas (for example, a mixture of $CF_4$ gas and $O_2$ gas) that the etching effect thereof is improved in the presence of plasma and $ClF_3$ gas.

In FIG. 4, 401 is a reaction vessel, 402 is a substrate, 403 is a heater for heating the substrate, 404 is a high frequency electric source of 13.56 MHz., 405 is a system for feeding starting gas for the formation of deposition film.

In the above experiment, the etching was carried out as follows. The etching gases are fed from the system 405 for feeding starting gas for the formation of deposition films to the reaction vessel 401, the etching was carried out under the conditions of the application of the high frequency electric power and under the conditions without the application of the high frequency electric power. In this procedure, the substrate temperature was maintained at 25° C. by use of a cooling apparatus not shown. The etching was carried out for 30 minutes. The etching state was evaluated based on the area of the portion removed by the etching. As    for those in which the denatured material on the aluminum substrate was completely removed by the etching, as for those with half or more was removed by the etching, as Δ for those with half or more was not removed by the etching, and as x for those was not substantially etched. The decision for removal by the etching was effected by decision of presence or absence of the denatured material on the substrate with the naked eye.

As shown in Table 2, it was found that $ClF_3$ was suitable for etching of the denatured product composed mainly of silicon accumulated on the reaction vessel inner wall. That is to say, it was confirmed that it is recognized as clear difference even with the naked eye that the etching speed by $ClF_3$ is higher than that by the conventional etching gas.

Further, even when the etching is carried out with applying RF electric power in the use of the conventional gas such as ($CF_4+O_2$) etc., it was impossible to obtain good results. However, in the use of $ClF_3$ gas, it was confirmed that excellent washing effects can be obtained even if RF electric power was not applied.

TABLE 2

| | Etching Conditions | | | |
|---|---|---|---|---|
| Etching gas | Flow rate (sccm) | Inner pressure Torr | RF power (mW/cm$^3$) | Etching state |
| $ClF_3$ | 20 | 1.0 | — |  |
| $ClF_3$ | 20 | 1.0 | 30 |  |
| $ClF_3$ | 20 | 0.5 | — |  |
| $ClF_3$ | 20 | 0.5 | 30 |  |
| $ClF_3$ | 30 | 0.5 | — |  |
| $ClF_3$ | 50 | 0.5 | — |  |
| $ClF_3$ | 50 | 0.05 | — |  |
| $ClF_3$ | 50 | 0.001 | — |  |
| $CF_4$ | 50 | 0.5 | 30 | x |
| $CF_4$ | 50 | 0.5 | — | x |
| $CF_4/O_2$ | 50/10 | 0.5 | 30 | Δ |
| $CF_4/O_2$ | 50/10 | 0.5 | — | x |
| $CF_4/H_2$ | 50/20 | 0.5 | 30 | x |
| $CF_4H_2$ | 50/20 | 0.5 | — | x |
| $SF_6/O_2$ | 30 | 0.5 | 30 | Δ |
| $SF_6/O_2$ | 30 | 0.5 | — | x |
| $NF_3$ | 50 | 0.5 | 30 | x |
| $NF_3$ | 50 | 0.5 | — | x |

EXPERIMENTAL EXAMPLE 2

As described in Experimental example 1, after amorphous silicon films were repeatedly formed on the cylindrical substrates (105, 205), an etching gas was introduced into the reaction vessel (101, 201) to remove the denatured products on the aluminum substrates without removing the aluminum substrates of 5 cm×5 cm square from the inner wall (111, 211) of the reaction vessel. Then, the aluminum substrates were taken out from the reaction vessel, and the etching state was evaluated by the same manner in the Experimental example 1. In the above procedure, after the cylindrical substrates (105, 205) on which amorphous silicon film was deposited were taken out from the reaction vessel the reaction vessel was evacuated and the etching gas was introduced from the pipes (108, 208) for introducing gases. The etching conditions and the results are shown in Table 3.

From Table 3, it was confirmed that the use of $ClF_3$ gas as the etching gas gives excellent washing effects under the conditions with or without applying microwave energy.

TABLE 3

| | Etching Conditions | | | | |
|---|---|---|---|---|---|
| Etching gas | Flow rate (sccm) | Inner pressure (Torr) | μW power (mW/cm$^3$) | Washing period (min) | Etching state |
| $ClF_3$ | 500 | 1.0 | — | 30 | |
| $ClF_3$ | 500 | 1.0 | 1.0 | 30 | |
| $CF_4/O_2$ | 1500/300 | 1.0 | — | 30 | x |
| $CF_4/O_2$ | 1500/300 | 1.0 | 1.0 | 30 | Δ |

EXPERIMENTAL EXAMPLE 3

After deposition films were formed under the same conditions for the formation of deposition films as in Experimental example 2, the denatured products on the aluminum substrates were removed under the same manner as in Experimental example 2 except that the etching was carried out under the conditions shown in Table 4. After the etching, the results were evaluated by the same manner as in Experimental example 1. The results are shown in Table 4.

TABLE 4

| | Etching Conditions | | | | |
|---|---|---|---|---|---|
| $ClF_3$ flow rates (sccm) | Diluted gases and flow rates (sccm) | | Inner pressure (Torr) | μW power (mW/cm$^3$) | Etching state |
| 500 | Ar | 100 | 1.0 | — | |
| 500 | Ar | 500 | 1.0 | — | |
| 200 | Ar | 500 | 1.0 | — | |
| 50 | Ar | 1000 | 1.0 | — | |
| 10 | Ar | 1000 | 1.0 | — | |
| 200 | $N_2$ | 500 | 1.0 | — | |
| 200 | $O_2$ | 500 | 1.0 | — | |
| 200 | He | 500 | 1.0 | — | |

From this example, it was confirmed that $ClF_3$ gas can be used with dilution and that it is preferably used at the concentration range of 100%–1%. $ClF_3$ gas is more preferably at the concentration of 70%–5%, most preferably 50%–10%. It was confirmed that the dilution can be effected with inert gas such as Ar, He, Ne, etc. or other gas such as $N_2$, $O_2$, etc.

Further, by other experiments, the following knowledge could be obtained.

Concerning the material of the reaction vessel, nickel alloys, aluminum alloys, SS41 steel, SUS304, SUS316, SUS430, quartz glass, etc. can be suitably used.

The temperature within the reaction vessel can be preferably 20° C. to 600° C., preferably 20° C. to 300° C., and most preferably 25° C.-200° C.

The inner pressure in the reaction vessel after introduction of $ClF_3$ gas may suitably be selected at an optimum range. Normally, it ranges from 1 m Torr–760 Torr preferably 1 m Torr to 100 Torr, most preferably 1 m Torr–10 Torr.

EXPERIMENTAL EXAMPLES 4–8

According to the preparation conditions shown in Table 5, deposition films composed mainly of silicon were formed repeatedly in the same manner as in Experimental example 1 and the denatured products accumulated on the inner wall of the reaction vessel were removed by etching with $ClF_3$ in the same manner as in Experimental example 1.

The etching conditions in the above procedure were as follows:

| flow rate of $ClF_3$ gas | 20 sccm |
|---|---|
| inner pressure of reaction vessel | 1.0 Torr |
| RF power | no |

As can be seen from Table 5, good etching results were obtained in all of the cases.

TABLE 5

| | Preparation conditions | | | | |
|---|---|---|---|---|---|
| | Starting gases and flow rates (sccm) | | Inner Pressure (mTorr) | μW power (W/cm$^3$) | Etching state |
| Experimental example 4 | $SiH_4$ | 700 | 0.5 | 0.5 | |
| | $H_2$ | 500 | | | |
| | $SiF_4$ | 30 | | | |
| Experimental example 5 | $SiH_4$ | 500 | 0.5 | 0.5 | |
| | $H_2$ | 500 | | | |
| | $B_2H_6$ (based on $SiH_4$) | 500 ppm | | | |
| Experimental example 6 | $SiH_4$ | 500 | 0.5 | 0.5 | |
| | $H_2$ | 300 | | | |
| | $GeF_4$ | 100 | | | |
| Experimental example 7 | $SiH_4$ | 150 | 0.3 | 0.3 | |
| | $CH_4$ | 500 | | | |
| Experimental example 8 | $SiH_4$ | 500 | 0.4 | 0.7 | |
| | $C_2H_2$ | 50 | | | |
| | $B_2H_6$ (based on $SiH_4$) | 5 ppm | | | |

EXPERIMENTAL EXAMPLE 9

Five kinds of deposition films as prepared in Experimental example 4–8 were prepared in the same manners as in Experimental examples 4–8 under the conditions shown in Table 5. The denatured products on the substrates were removed by etching in the same manner as in Experimental example 2 under the etching conditions (without application of μW power) with $ClF_3$ as shown in Table 3. Then, the etching states were evaluated. As the results, in all of the cases, good etching results were obtained similar to Experimental examples 4–8.

In the following, specific examples for verifying the present invention are to be described, but the present invention is not limited at all by these examples.

EXAMPLE 1

By use of the μW-PCVD device shown in FIG. 1 to FIG. 3, according to the procedure as described previously, preparation of photoconductive members for electrophotography was conducted continuously for 10 cycles according to the preparation conditions shown in Table 6. After the 10th photoconductive member was prepared, the photoconductive member was taken out from the reaction vessel. Then, ClF$_3$ gas was fed from the pipes (108, 208, 308) for feeding starting gases to the reaction vessel, and thereafter the reaction vessel was internally cleaned according to the conditions shown in Table 7, and subsequently further preparation of photoconductive members for electrophotography was conducted.

Figure 5:
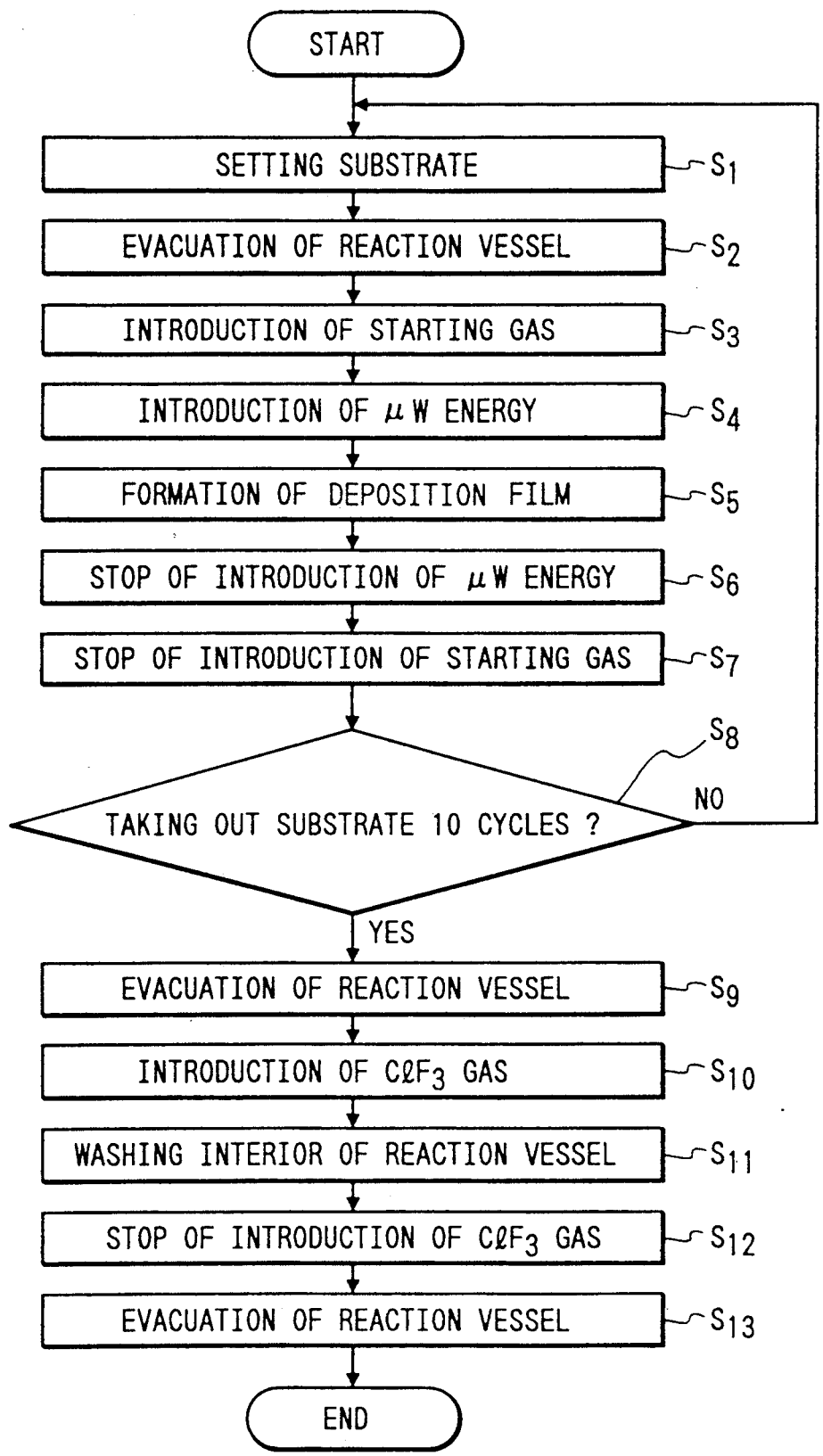
FIG. 5 is a schematic view for explaining one embodiment of a process for the formation of deposition films according to the $\mu$W-PCVD method and a process for washing the interior of the reaction vessel with $ClF_3$ gas.

Referring to FIG. 5, cylindrical substrates (105, 205) were set (S$_1$) in the reaction vessel (101, 201, 301), the interior of the reaction vessel was evacuated (S$_2$). Then, the starting gases were introduced (S$_3$) from an apparatus (310) for feeding starting gases into the reaction vessel, $\mu$W energy was introduced (S$_4$), and the formation (S$_5$) of deposition films was carried out. The formation (S$_5$) of deposition films means the following procedure; when the first layer constituting the deposition film becomes the desired film thickness, the second layer was formed by introduction of starting gases for the second layer into the reaction vessel instead of the starting gases for the first layer, and the desired deposition films were formed in the same manner as described above, for the third layer and after that. The formation (S$_5$) of the deposition films was completed by the step (S$_6$) of introduction of $\mu$W energy. Thereafter, the substrates were taken out (S$_8$) from the reaction vessel (101, 201, 301). After the photoconductive members of 10th cycle were taken out from the reaction vessel, the reaction vessel was evacuated (S$_9$). Then, the etching gas was introduced (S$_{10}$) from the apparatus (310) for introducing starting gases into the reaction vessel (101, 201, 301) through the pipe (108, 208) for feeding starting gases to wash the interior of the reaction vessel (101, 201, 301). After the introduction of the etching gas into the reaction vessel was stopped (S$_{12}$), the interior of the reaction vessel (101, 201, 301) was evacuated (S$_{13}$), and the procedure returned back to the step (S$_1$) for setting substrate.

TABLE 6

| Name of layer | Introduced gases and flow rates (sccm) | | Substrate temperature (°C.) | Inner pressure (mTorr) | $\mu$W power (W/cm$^3$) | Layer thickness ($\mu$m) |
| --- | --- | --- | --- | --- | --- | --- |
| First layer | SiH$_4$ | 500 | 250 | 0.4 | 0.5 | 3 |
| | H$_2$ | 300 | | | | |
| | SiF$_4$ | 20 | | | | |
| | B$_2$H$_6$ (Based on on SiH$_4$) | 1000 ppm | | | | |
| Second layer | SiH$_4$ | 700 | 250 | 0.5 | 0.5 | 20 |
| | H$_2$ | 500 | | | | |
| | SiF$_4$ | 30 | | | | |
| | B$_2$H$_6$ (based on SiH$_4$) | 0.3 ppm | | | | |
| Third layer | SiH$_4$ | 150 | 250 | 0.3 | 0.5 | 0.5 |
| | CH$_4$ | 500 | | | | |

TABLE 7

| | Etching gas | Flow rate (sccm) | Inner pressure (mTorr) | $\mu$W power (W/cm$^3$) | Washing time (min) |
| --- | --- | --- | --- | --- | --- |
| Example 1 | ClF$_3$ | 500 | 1.0 | . . . | 30 |
| Comparative example 1-2 | CF$_4$ O$_2$ | 1500 300 | 1.0 | 1.0 | 360 |

COMPARATIVE EXAMPLE 1—1

In Example 1, without washing the interior of the reaction vessel, preparation of photoconductive members for electrophotography was subsequently conducted.

COMPARATIVE EXAMPLE 1-2

In Example 1, cleaning the interior of the reaction vessel was performed according to the conditions shown in Table 7 by use of a gaseous mixture of CF$_4$ and O$_2$ of the conventional method as the etching gas in place of ClF$_3$ gas, and subsequently preparation of photoconductive members for electrophotography was conducted.

The photoconductive members prepared in Example 1, Comparative example 1—1 and Comparative example 1-2 were respectively set in an electrophotographic device which was a copying machine NP 7550 modified for experimentation, the image-formation was carried out, and generation of image defect was evaluated.

Actually, the procedure was carried out as follows. A solid black original was used, and the ratio of white dots generated in a solid black copy image on a A-3 paper was determined. Then, "A" expresses a particularly excellent photoconductive member for electrophotography in which no white dot of 0.3 mm or longer is observed, "B" excellent one in which several white dots of 0.3 mm–0.5 mm are observed, "C" one having less than 10 white dots of 0.5 mm–0.8 mm and no problem in practice, "D" one having 10 or more white dots of 0.5 mm–0.8 mm and slightly problem in practice, and "E" one in which a white dot larger than 0.8 mm is observed and which can not stand application in practice.

From Table 8, it can be understood that photoconductive members for electrophotography having good image characteristics and excellent quality can be stably obtained in the application to photoconductive member for electrophotography of the deposition film since film defects in the deposition film is suppressed by addition of the washing step according to the present invention.

TABLE 8

| | | Image defect rank |
| --- | --- | --- |
| Example 1 | Initial stage | A |
| | 10th cycle | C |
| | 11th cycle (after cleaning) | A |
| | 20th cycle | C |
| | 21st cycle (after cleaning) | A |
| | 30th cycle | C |
| | 31st cycle (after cleaning) | A |
| Comparative example 1-1 | Initial stage | A |
| | 10th cycle | C |
| | 15th cycle | D |
| | 20th cycle | E |
| Comparative example 1-2 | Initial stage | A |
| | 10th cycle | C |
| | 11th cycle (after cleaning) | B |
| | 15th cycle | C |
| | 20th cycle | D |
| | 21st cycle (after cleaning) | C |
| | 25th cycle | D |
| | 30th cycle | E |
| | 31st cycle (after cleaning) | D |

EXAMPLE 2

A photoconductive member for electrophotography was prepared under the same operations as in Example 1 except for the preparation conditions shown in Table 9, and the evaluation for the generation of image defects was conducted. Good results were obtained similarly as in Example 1 by considerable suppression of image defect.

TABLE 9

| Name of layer | Starting gases and flow rates (sccm) | | Substrate temperature (°C.) | Inner pressure (mTorr) | μW power (W/cm³) | layer thickness (μm) |
|---|---|---|---|---|---|---|
| First layer | SiH₄ | 500 | 250 | 0.4 | 0.5 | 0.5 |
| | H₂ | 300 | | | | |
| | SiF₄ | 20 | | | | |
| | B₂H₆ (based on SiH₄) | 1000 ppm | | | | |
| | GeH₄ | 100 | | | | |
| | NO | 10 | | | | |
| Second layer | SiH₄ | 500 | 250 | 0.4 | 0.5 | 3 |
| | H₂ | 300 | | | | |
| | SiF₄ | 20 | | | | |
| | B₂H₆ (based on SiH₄) | 1000 ppm | | | | |
| Third layer | SiH₄ | 700 | 250 | 0.5 | 0.5 | 20 |
| | H₂ | 500 | | | | |
| | SiF₄ | 30 | | | | |
| | B₂H₆ (based on SiH₄) | 0.3 ppm | | | | |
| Fourth layer | SiH₄ | 700 | 250 | 0.3 | 0.5 | 0.5 |
| | CH₄ | 500 | | | | |

EXAMPLE 3

A photoconductive member for electrophotography was prepared under the preparation conditions shown in Table 10, and the same operations as in Example 1 were conducted, and the evaluation for the generation of image defect was conducted. Good results were obtained similarly as in Example 1 by considerable suppression of image defect.

TABLE 10

| Name of layer | Starting gases and flow rates (sccm) | | Substrate temperature (°C.) | Inner pressure (mTorr) | μW power (W/cm³) | layer thickness (μm) |
|---|---|---|---|---|---|---|
| First layer | SiH₄ | 500 | 250 | 0.4 | 0.7 | 3 |
| | C₂H₂ | 50 | | | | |
| | SiF₄ | 5 | | | | |
| | B₂H₆ (based on SiH₄) | 300 ppm | | | | |
| Second layer | SiH₄ | 500 | | 0.4 | 0.7 | 20 |
| | C₂H₂ | 50 | | | | |
| | SiF₄ | 5 | | | | |
| | B₂H₆ (based on SiH₄) | 5 ppm | | | | |
| Third layer | SiH₄ | 700 | 250 | 0.5 | 0.5 | 1 |
| | H₂ | 500 | | | | |
| Fourth layer | SiH₄ | 150 | 250 | 0.3 | 0.3 | 0.5 |
| | CH₄ | 500 | | | | |

According to the method for washing the deposition film-forming device described in the above examples, the non-discharging regions in the reaction vessel, etc. of the deposition film-forming device, in which functional deposition films composed mainly of silicon are formed, can be cleaned with good efficiency, and consequently, the quality of the functional deposition films formed can be maintained at high level, and yet productivity can also be improved.

As described above in detail, according to the method for washing the deposition film-formation device of the present invention, the attachment on the inner wall of the reaction vessel of the deposition film-forming device utilizing microwave energy can be effectively removed. Thus, the quality of the deposition film formed can be maintained at high level, and yet productivity can also be improved since the yield in the preparation can be remarkably improved. For example, when photoconductive members for electrophotography are prepared by the formation of deposition film is carried out after the deposition film-forming device is washed according to the washing method of the present invention, images of high quality with remarkably suppressed image defect can be obtained even when either one of photoconductive members for electrophotography is used.

I claim:

1. A method for cleaning excess reaction product from a deposition film-forming device which utilizes microwave plasma chemical vapor deposition for forming a deposition film on a substrate positioned in a reaction vessel, which comprises: (a) introducing ClF₃ gas into said reaction vessel after removing said substrate upon which said deposition film is formed from said reaction vessel; and (b) applying microwave energy, thereby removing the reaction product attached on the interior of said reaction vessel during formation of the deposition film.

2. The method according to claim 1, in which said deposition film is a deposition film containing silicon.

3. The method according to claim 1, in which said deposition film is used in photoconductive member for electrophotography.

4. The method according to claim 1, in which the material of the reaction vessel is selected from aluminum alloy, nickel alloy, SS41 steel, SUS304, SUS316, SUS430 and quartz glass.

* * * * *

UNITED STATES PATENT AND TRADEMARK OFFICE
CERTIFICATE OF CORRECTION

PATENT NO. : 4,998,979
DATED : March 12, 1991
INVENTOR(S) : HIROAKI NIINO

Page 1 of 6

It is certified that error appears in the above-identified patent and that said Letters Patent is hereby corrected as shown below:

On the title page:

IN [56] REFERENCES CITED

U.S. PATENT DOCUMENTS,
"Flamm" should read --Flamm et al.--;
"Cook" should read --Cook et al.--;
"Senoue" should read --Senoue et al.--; and
"Barkanic" should read --Barkanic et al.--.

COLUMN 1

Line 23, "Related Background Art" should read
--2. Related Background Art--.
Line 37, "on" should read --to--.
Line 41, "as" should read --are--.

COLUMN 6

Line 17, "As" should read --As ⊚ --.
Line 19, "as" should read --as ○ --.
Line 20, Close up left margin.
TABLE 2, Line 57, "$CF_4H_2$" should read --$CF_4/H_2$--.

UNITED STATES PATENT AND TRADEMARK OFFICE
CERTIFICATE OF CORRECTION

PATENT NO. : 4,998,979
DATED : March 12, 1991
INVENTOR(S) : HIROAKI NIINO

It is certified that error appears in the above-identified patent and that said Letters Patent is hereby corrected as shown below:

COLUMN 6

TABLE 2, "Etching    should    --Etching
      state        read         state

```
                                    ⊚
                                    ⊚
                                    ⊚
                                    ⊚
                                    ⊚
                                    ⊚
                                    ⊚
                                    ⊚
       X                            X
       X                            X
       Δ                            Δ
       X                            X
       X                            X
       X                            X
       Δ                            Δ
       X                            X
       X                            X
       X  "                         X  --.
```

UNITED STATES PATENT AND TRADEMARK OFFICE
CERTIFICATE OF CORRECTION

PATENT NO. : 4,998,979
DATED : March 12, 1991
INVENTOR(S) : HIROAKI NIINO

Page 3 of 6

It is certified that error appears in the above-identified patent and that said Letters Patent is hereby corrected as shown below:

COLUMN 7

TABLE 3, "Etching state ... X Δ" should read --Etching state ... ⊚ ⊙ X Δ --.

TABLE 4, "Etching state ... " should read --Etching state ... ⊚ ⊙ ⊚ ⊙ ⊚ ⊙ ⊚ ⊚ --.

UNITED STATES PATENT AND TRADEMARK OFFICE
CERTIFICATE OF CORRECTION

PATENT NO. : 4,998,979
DATED : March 12, 1991
INVENTOR(S) : HIROAKI NIINO

It is certified that error appears in the above-identified patent and that said Letters Patent is hereby corrected as shown below:

COLUMN 8

TABLE 5, "Etching state   should read   --Etching state
◎
◉
◎
◉
◎
"   --.

Line 49, "manners" should read --manner--.

COLUMN 9

TABLE 6, Line 50, "on on"   should read   --on--.

UNITED STATES PATENT AND TRADEMARK OFFICE
CERTIFICATE OF CORRECTION

PATENT NO. : 4,998,979
DATED : March 12, 1991
INVENTOR(S) : Hiroaki Niino It is certified that error appears in the above-identified patent and that said Letters Patent is hereby corrected as shown below:

Column 11, delete table 10, and substitute therefor Table 10 as shown on the attached sheet.

Table 10

| Name of layer | Starting gases and flow rates (sccm) | Substrate temperature (°C) | Inner pressure (mTorr) | μW power (W/cm$^3$) | layer thickness (μm) |
|---|---|---|---|---|---|
| First layer | $SiH_4$ 500<br>$C_2H_2$ 50<br>$SiF_4$ 5<br>$B_2H_6$ 300ppm (based on $SiH_4$) | 250 | 0.4 | 0.7 | 3 |
| Second layer | $SiH_4$ 500<br>$C_2H_2$ 50<br>$SiF_4$ 5<br>$B_2H_6$ 5ppm (based on $SiH_4$) | 250 | 0.4 | 0.7 | 20 |

UNITED STATES PATENT AND TRADEMARK OFFICE
CERTIFICATE OF CORRECTION

PATENT NO. : 4,988,979
DATED : March 12, 1991
INVENTOR(S) : Hiroaki Niino It is certified that error appears in the above-identified patent and that said Letters Patent is hereby corrected as shown below:

Column 11, delete table 10, and substitute therefor Table 10 as shown on the attached sheet.

| Third layer | $SiH_4$ | 700 | | | | |
| | $H_2$ | 500 | 250 | 0.5 | 0.5 | 1 |
| Fourth layer | $SiH_4$ | 150 | 250 | 0.3 | 0.3 | 0.5 |
| | $CH_4$ | 500 | | | | |

Signed and Sealed this

Ninth Day of March, 1993

*Attest:*

STEPHEN G. KUNIN

*Attesting Officer*     *Acting Commissioner of Patents and Trademarks*